(12) United States Patent
Nanda et al.

(10) Patent No.: US 7,193,549 B1
(45) Date of Patent: Mar. 20, 2007

(54) SCHEME FOR DETERMINING INTERNAL MODE USING MCLK FREQUENCY AUTODETECT

(75) Inventors: Kartik Nanda, Austin, TX (US); Giri Rangan, Austin, TX (US); Aryesh Amar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 427 days.

(21) Appl. No.: 10/891,944

(22) Filed: Jul. 15, 2004

Related U.S. Application Data (60) Provisional application No. 60/574,330, filed on May 25, 2004.

(51) Int. Cl.
*H03M 1/66* (2006.01)

(52) U.S. Cl. .................... 341/144; 341/123; 341/61

(58) Field of Classification Search ............. 341/144, 341/123, 61, 141, 143; 713/600
See application file for complete search history.

(56) References Cited

U.S. PATENT DOCUMENTS

| | | | | |
|---|---|---|---|---|
| 5,532,556 A | * | 7/1996 | Anderson et al. | ........... 375/356 |
| 5,689,534 A | * | 11/1997 | Anderson et al. | ........... 375/364 |
| 6,184,905 B1 | * | 2/2001 | Hartog | ........... 345/534 |
| 6,492,928 B1 | | 12/2002 | Rhode et al. | ........... 341/144 |
| 6,531,975 B1 | * | 3/2003 | Trotter et al. | ........... 341/144 |
| 6,754,295 B1 | * | 6/2004 | Hartnett | ........... 375/356 |

\* cited by examiner

*Primary Examiner*—Peguy JeanPierre
(74) *Attorney, Agent, or Firm*—Steven Lin; Jack V. Musgrove (57) ABSTRACT

A method of determining an internal operating mode of an electronic circuit derives multiple comparison rates from a rate of a master clock input, computes one or more clock ratios of the comparison rates to a rate of a sample rate clock input, and determines whether any of the clock ratios is a valid ratio representing a supported clock configuration. The appropriate internal operating mode is then selected based on the valid ratio. In the illustrative embodiment, a clock autodetect unit uses two trip frequencies to derive at least first and second clock comparison rates. The audio converter can operate in three distinct modes (base, high and quad modes). The base mode is selected when the clock ratio is about 256, the high mode is selected when the clock ratio is about 128, and the quad mode is selected when the clock ratio is about 64. A multiplexer can be used to sequence through the computer clock ratios to ensure that a highest valid ratio is used among a plurality of valid ratios.

32 Claims, 5 Drawing Sheets

SCHEME FOR DETERMINING INTERNAL MODE USING MCLK FREQUENCY AUTODETECT

CROSS-REFERENCE TO RELATED APPLICATION

This application claims priority from U.S. Provisional Patent Application No. 60/574,330, entitled "CLOCK MODE DETECTION SCHEMES IN DATA CONVERTERS" filed May 25, 2004, which is hereby incorporated.

BACKGROUND OF THE INVENTION

1. Field of the Invention

The present invention generally relates to clocking systems for electronic circuits, and more particularly to a method of determining which of a plurality of different operating modes is to be used by a circuit, which is adapted to receive a variety of external clock signals.

2. Description of the Related Art

Various types of electronic circuits have been constructed that support a wide range of different clock modes. For example, data converters can operate in different speed modes in which different master clock rates and sample clock rates are used. A digital-to-analog converter might have two operating modes, such as a base mode and a high mode, depending on what master clock rate and sample clock rate are being provided from the front-end circuitry. This capability allows a single converter to support multiple applications and gives the end-user (i.e., the final product manufacturer) greater flexibility in the design of the overall electronic system.

Figure 1:
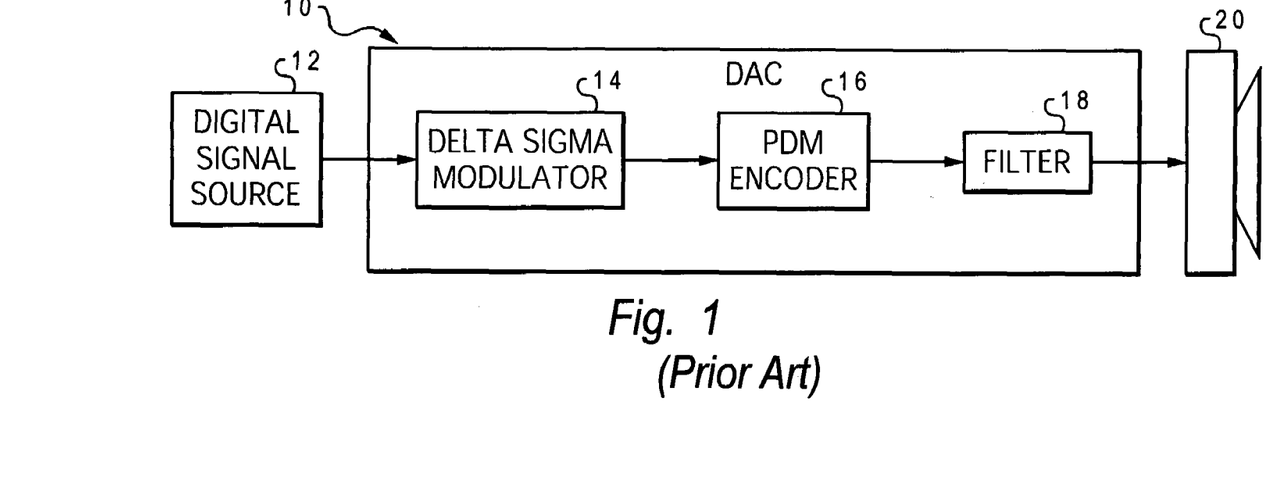
FIG. 1 is a block diagram of a conventional digital-to-analog converter which utilizes a delta-sigma modulator and pulse-density modulation encoding.

A conventional digital-to-analog converter (DAC) 10 is illustrated in FIG. 1 and includes a digital (binary) signal source 12, which provides the primary input to a delta-sigma modulator 14. The digital signal source could be from, e.g., a digital radio receiver, an audio compact disc (CD), a digital audio tape (DAT), a digital video disc (DVD), a broadcast satellite, or personal computer (PC) audio. Delta-sigma modulator 14 feeds a multilevel noise-shaped signal based on the digital input stream to a multi-level pulse-density modulation (PDM) encoder 16. PDM encoder 16 turns the signal from delta-sigma modulator 14 into a multi-level, discrete-time analog signal. Low-pass filter 18 removes high frequencies from the output, and the filtered output then drives some other device such as a speaker 20.

Conventional data converters have dramatically grown in complexity and capability, and their clocking systems have also grown in complexity to more fully utilize the function and high performance provided by CMOS technology. A typical clocking system can provide a multiplicity of timing signals to the internal converter elements and to external devices. These clocks define the timing cycle for the data flow of the machine. Some clock signals can be non-overlapping and serve to isolate one cycle of operation from the next cycle, while other clock signals overlap so as to gain a performance advantage by anticipating the next cycle of operation. The positioning in time of these clocks is very critical for high performance, particularly for circuits such as DACs which operate in a pipelined manner, that is, are divided into separate stages such that a single DAC can actually be simultaneously performing multiple tasks for different (successive) data sequences during a single clock cycle. However, this scheme requires precise timing. External device considerations may also require fairly exact timing signals. Clock design becomes further complicated when a DAC must support a variety of external clock inputs.

DAC 10, for example, might support frequency ranges from a sample rate of 2 kHz and master clock rate of 0.5 MHz, to a sample rate of 192 kHz and a master clock rate of 48 MHz, all as part of distinct internal operating modes. The master clock signal is used to derive most of the control signals for the components of DAC 10, and the sample rate signal represents the sampling rate for the encoder which previously created the digital signal stream from an original analog source. CDs typically use a sampling rate of 44.1 kHz, PC audio uses a sampling rate of 48 kHz, DVDs use a sampling rate of 96 kHz, and other high-end equipment can use a sampling rate of up to 192 kHz. Depending upon the particular operating mode that is selected, any or all of the components within DAC 10 (modulator 14, PDM encoder 16, and/or filter 18) might operate in a different manner.

Some devices provide a control port or other input that allows the user to explicitly select the desired clock configuration. However, this approach requires a higher pin count on the external physical interface for the integrated circuit (IC) which constitutes the device and assumes that the front-end circuitry will provide the mode selection signal. Accordingly, some converters have been devised which automatically determine the appropriate clock configuration based on the sample rate clock (or left/right clock, "LRCK") and master clock ("MCLK") frequencies. For instance, if the end-user provides an LRCK of 48 kHz and an MCLK of 12 MHz, these rates might imply a base mode of operation for the DAC, while a 96 kHz LRCK rate and a 12 MHz MCLK rate might imply a high mode of operation. The appropriate mode can be determined for these cases by simply examining the ratio of MCLK to LRCK, i.e., by counting the number of high signals for MCLK in an LRCK period. If the ratio is around 256, the base mode is enabled, and if the ratio is around 128, the high mode is enabled.

As digital signal processing technology improves and changes, a wider variety of clock rates must be supported to allow a single converter to be used in a growing number of applications. Unfortunately, existing solutions for establishing the proper clock configuration have become inadequate as more clock rate combinations are employed. For example, devices which utilize an LRCK of 48 kHz and an MCLK of 12 MHz currently exist for operation at a base rate, and other devices which utilize an LRCK of 96 kHz and an MCLK 24 MHz for operation at a high rate. Supporting both of these clock configurations would be preferable. However, the MCLK/LRCK ratio is the same for both (around 256) and selection of the base mode would result in improper operation for the latter case.

Another solution for determining the clock configuration examines the MCLK rate by comparing it to an internally generated frequency. A single comparison frequency can be so used for a wide range of MCLK rates, by dividing the MCLK signal using increasing integer values until it is at or near the internally generated value. A device that supported MCLK rates of 12 MHz, 18 MHz and 24 MHz could use a comparison frequency of 6 MHz and divide the MCLK signal successively by the integers 2, 3, and 4 until the quotient was around 6 MHz. This approach, however, also becomes unfeasible as alternative clock configurations arise which utilize the same master clock frequency and with more variation in the master clock rates.

In light of the foregoing, it would be desirable to devise an improved method for determining which of a plurality of clock configurations is to be used for an electronic device, such as a data converter. It would be further advantageous if the method were not solely dependent on either a master clock rate value or a ratio of two external clock signals.

SUMMARY OF THE INVENTION

The present invention provides an improved method and circuit for determining an internal operating mode of an electronic device based on externally provided clock signals.

The present invention provides a data converter which can operate in a plurality of different modes and support a plurality of different clock configurations for those modes.

The present invention provides a digital-to-analog converter that can automatically detect which operating mode is to be used based on external clock signals without adding excessive overhead to the circuit design and still allow for significant deviations in clock reference signals.

The present invention is a method for determining an internal operating mode of an electronic circuit such as an audio converter. The method involves deriving multiple comparison rates from a rate of a master clock input, computing one or more clock ratios of the comparison rates to a rate of a sample rate clock input, and determining whether any of the clock ratios is a valid ratio (i.e., one of a plurality of predetermined clock ratios) representing a supported clock configuration. The appropriate internal operating mode for the electronic circuit is then selected based on the valid ratio. In the illustrative embodiment, a clock autodetect unit derives at least first and second clock comparison rates, in which the first clock comparison rate is the same as the rate of the master clock input when the rate of the master clock input is less than or equal to a first trip frequency but is a fraction of the rate of the master clock input when the rate of the master clock input is greater than the first trip frequency. The second clock comparison rate is the same as the rate of the master clock input when the rate of the master clock input is less than or equal to a second trip frequency but is a fraction of the rate of the master clock input when the rate of the master clock input is greater than the second trip frequency. For example, to support master clock frequencies in the range of 8 MHz to 33 MHz, the first trip frequency is preferably at or around 16 MHz, and the second trip frequency is at or around 24 MHz. For the case in which the audio converter operates in three distinct modes (base, high, and quad), the base mode is selected when the clock ratio is at or about 256, the high mode is selected when the clock ratio is at or about 128, and the quad mode is selected when the clock ratio is at or about 64. A multiplexer can be used to sequence through the computed clock ratios to ensure that a highest valid ratio is used among a plurality of valid ratios.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
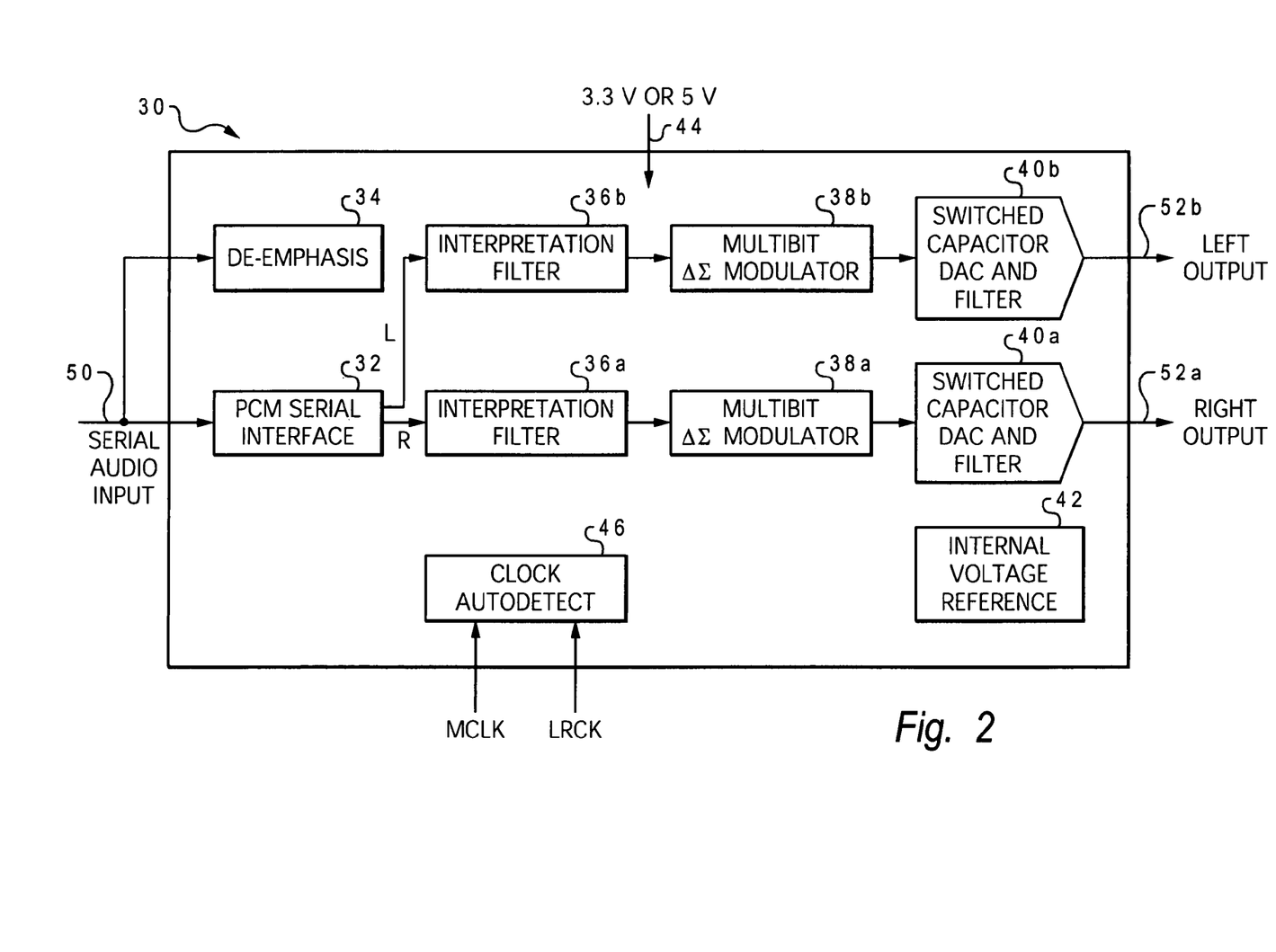
FIG. 2 is a block diagram of one embodiment of a stereo digital-to-analog converter constructed in accordance with the present invention.

With reference now to FIG. 2, one embodiment 30 of a digital-to-analog converter (DAC) constructed in accordance with the present invention is depicted. In this embodiment, DAC 30 operates as a 24-bit stereo D/A converter packaged in an integrated circuit (IC) chip having ten interconnection pins. DAC 30 generally includes a serial interface 32, de-emphasis logic 34, a pair of interpolation filters 36a, 36b, a pair of multibit delta-sigma modulators 38a, 38b, a pair of switched-capacitor DAC and filters 40a, 40b, an internal voltage reference 42, a single power supply 44 (e.g., 3.3 volts or 5 volts), and a clock autodetect unit 46. As explained further below, DAC 30 is adapted to support a wide variety of audio data interface formats having different master clock frequencies up to 49.1 MHz and different sample rate clock frequencies up to 192 kHz, and can operate in three different clock modes: base, high and quad modes. DAC 30 is particularly suited for audio applications, such as DVD players and recorders, digital televisions, home theater and set-top box products, and automotive audio systems.

A serial audio (data) input 50 is externally provided from front-end circuitry, representing a digitally-encoded stream of the combined left and right stereo channels that are to be reproduced. In this embodiment, DAC 30 utilizes two's complement serial audio data and accepts data at standard audio sample rates (LRCK) of 48 kHz, 44.1 kHz and 32 kHz in base mode, 96 kHz, 88.2 kHz and 64 kHz in high mode, and 192 kHz, 176.4 kHz and 128 kHz in quad mode. A serial clock is used to control the shifting of data into input data buffers. DAC 30 supports generation of both external and internal serial clock signals. With internal serial clock generation, the serial clock rate (SCLK) is derived from and synchronous with the master clock signal (MCLK) and LRCK. For example, the SCLK/LRCK frequency ratio can be set to 32, 48 or 64 depending upon the data format used (I²S format, left justified format, or right justified format). The master clock rate is an integer ratio of the sample rate, but not all sample rates are necessarily supported for all clock ratios. A phase relationship between MCLK, LRCK and SCLK is not required.

Serial interface 32 receives the data input 50 and acts as a switch to route the left and right serial data to the interpolation filters, i.e., the right channel data is fed to interpolation filter 36a and the left channel data is fed to interpolation filter 36b. The serial audio input is also received by de-emphasis logic 34. De-emphasis logic 34 is enabled only with internal serial clock generation and provides a de-emphasis curve having a frequency response which scales proportionally as the sample rate changes. De-emphasis provides additional digital filtering.

Interpolation filters 36a, 36b combine the interpolation and low pass filter response functions and can provide different passband characteristics depending upon the particular mode employed (base, high, or quad mode). The interpolation filters are respectively connected to the delta-sigma modulators, i.e., the output of interpolation filter 36a is connected to delta-sigma modulator 38a and the output of interpolation filter 36b is connected to delta-sigma modulator 38b. Delta-sigma modulators 38a, 38b are fourth order multi-bit modulators that provide quantized values used to drive the respective analog filters 40a, 40b. In this embodiment, each analog filter is actually a switched-capacitor DAC followed by a continuous-time low pass filter. The full-scale analog output voltage at outputs 52a, 52b is nominally about 0.688 times the DC power supply voltage.

Figure 3:
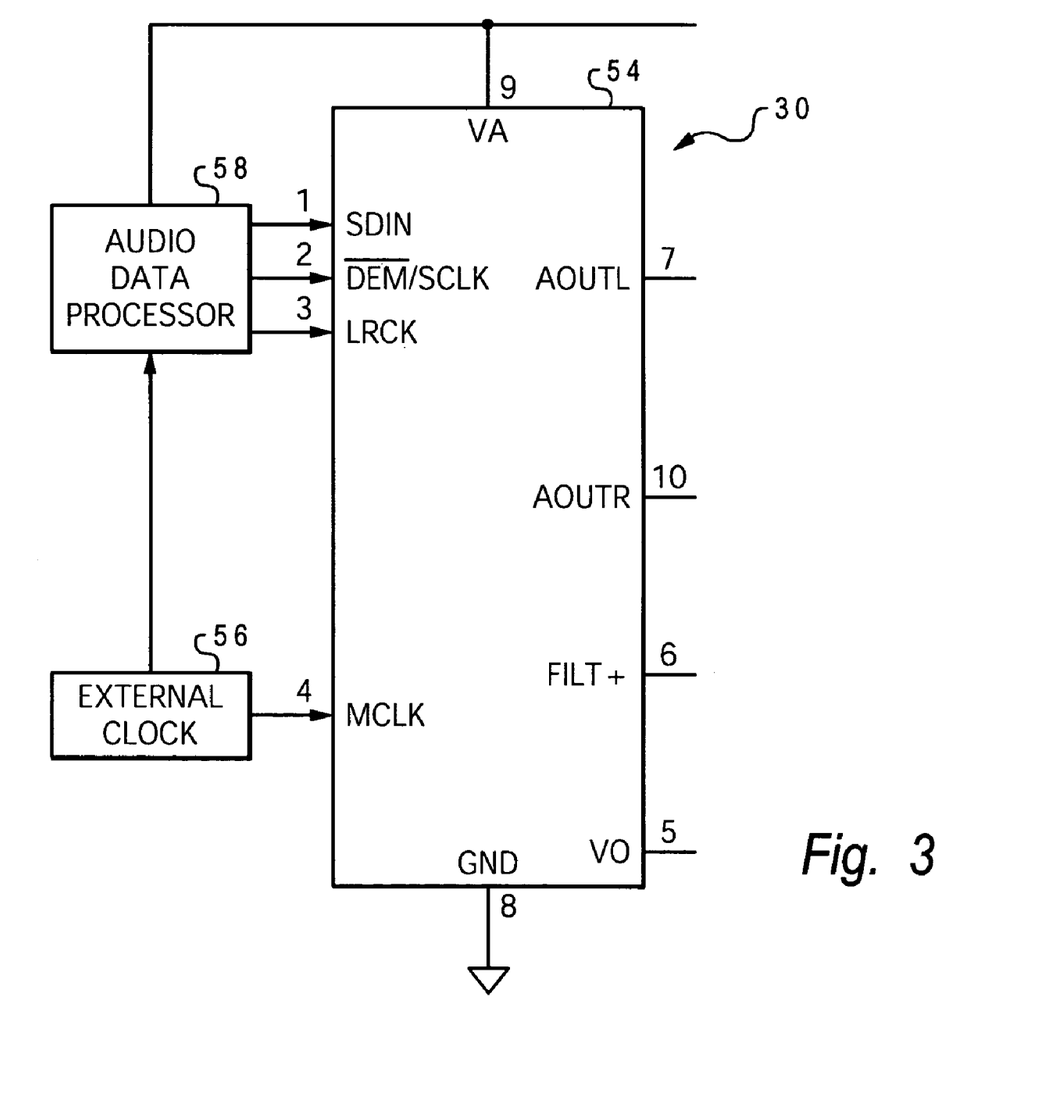
FIG. 3 is a connection diagram showing an exemplary layout for the input and output pins of an integrated circuit chip which has the digital-to-analog converter of FIG. 2 formed thereon.

Referring now to FIG. 3, a physical layout is shown of the interconnection pins (input and output) on the integrated circuit chip 54 for this embodiment of DAC 30. Pin # 1 is the pin for the serial audio data input (SDIN). Pin # 2 is the pin for the de-emphasis/external serial clock input (DEM/SCLK) used alternatively for enabling the de-emphasis logic or receiving the external serial clock input. Pin # 3 is the pin for the sample rate clock input (LRCK) that determines which channel, left or right, is currently active on the serial audio data line. Pin # 4 is the pin for the master clock input (MCLK) used as the clock source for the delta-sigma modulators and digital filters. Pin # 5 is the pin for an analog common mode output, or quiescent voltage (VQ). Pin # 6 is the pin for a positive reference voltage output for the internal sampling circuits (FILT+), i.e., voltage reference 42. Pin # 7 is the pin for the left channel analog output (AOUTL), i.e., output 52b. Pin # 8 is the pin for a reference input for electrical ground (GND). Pin # 9 is the pin for the analog power source input (VA), i.e., 3.3 volts or 5 volts. Pin # 10 is the pin for the right channel analog output (AOUTR), i.e., output 52a. In the system configuration shown in FIG. 3, an external clock 56 provides the MCLK signal directly to DAC 30 and also to an audio data processor 58, which, in turn, provides the SDIN, DEM/SCLK and LRCK.

DAC 30 is initialized at power-up by resetting interpolation filters 36a, 36b and delta-sigma modulators 38a, 38b. Power to internal voltage reference 42 and back-end filters 40a, 40b is initially cut off and remains so until MCLK and LRCK are present. Once MCLK and LRCK are detected, the clock configuration is examined by the autodetect unit 46 to determine the desired operating mode (base, high or quad mode) based on the supported combinations of MCLK and LRCK. Internal dividers are then appropriately set to generate the proper clock signals, and power is applied to internal voltage reference 42. Power is thereafter applied to back-end filters 40a, 40b and the analog outputs 52a, 52b will ramp to the common mode VQ. The audio outputs, AOUTL and AOUTR, can be clamped to VQ when the device is initially powered-up to reduce the effects of output transients.

The three modes of operation contemplated in the illustrative embodiment (base rate mode, high rate (or double speed) mode and quad rate mode), dictate what the output sample rate is for the DAC (or what the input sample rate would be for an ADC). More generally, the different operating modes represent two or more distinct methods of processing digital information signals input to the digital-to-analog converter. An operating mode can consist of both the clocks used within the chip, and other configuration information such as the appropriate filters to utilize. In this embodiment, three modes are used because different customers (i.e., end-use devices) have different requirements which can be suitably addressed using the three different modes. For instance, CD audio at 44.1 kHz is base rate mode, while DVD audio at 192 kHz is quad rate mode. While different modes have different sample rates, the chip clock (MCLK) may be the same for all the modes. Different modes may also have different on-chip filtering. One mode might support different features that are not supported in other modes. An example is the de-emphasis in the present chip. A given mode can cover a range of sample rates, not necessarily just one rate, e.g., base rate could be anywhere from 32 kHz to 64 kHz, high rate from 80 kHz to 128 kHz and so on. In the illustrative embodiment, filters 52a, 52b operate differently based on the particular mode employed, but alternative embodiments could allow other components (e.g., the modulators) to have different modes of operation for different clock configurations. Filters 52a, 52b have different low pass characteristics depending upon the particular clock mode used and can also use different amounts of interpolation. By utilizing the clock autodetect feature of the present invention, a single DAC can be integrated into a wider variety of end-use devices.

Figure 4:
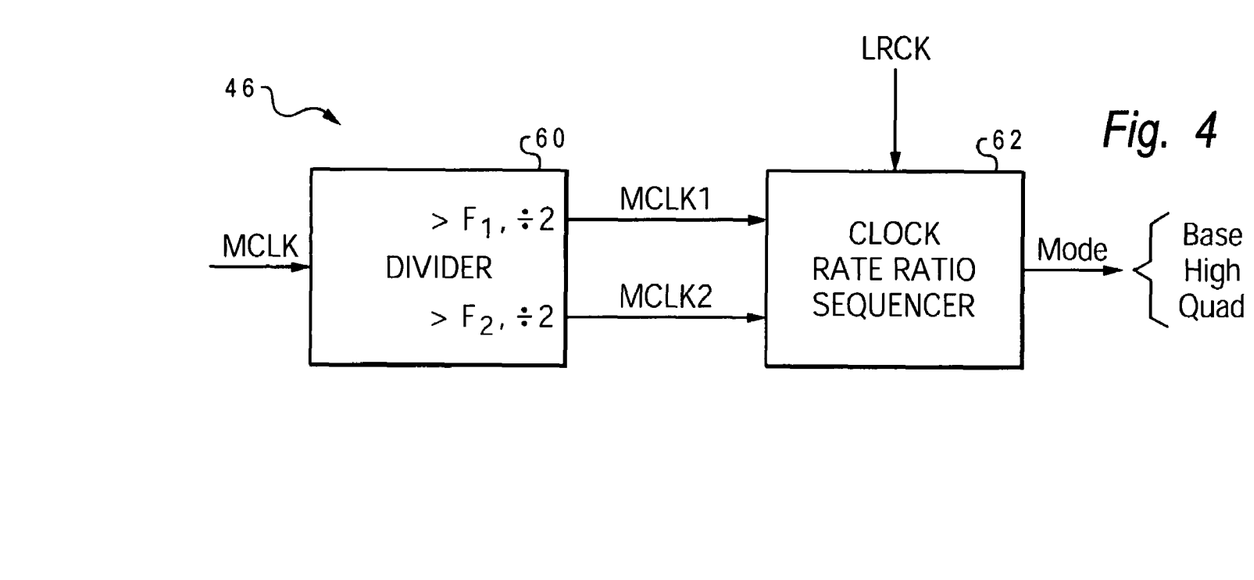
FIG. 4 is a block diagram of one embodiment of an autodetect unit for use with the digital-to-analog converter of FIGS. 2 and 3 which determines the appropriate operating mode based on a clock configuration provided by external clock signals in accordance with the present invention.

With further reference to FIGS. 4 to 7, autodetect unit 46 is designed to determine the desired operating mode for DAC 30 by computing a ratio of MCLK (or a rate derived from MCLK) to LRCK and then validating a supported clock configuration based on this MCLK/LRCK ratio. FIG. 4 is a high-level diagram of one embodiment of autodetect unit 46 which includes a divider 60 and a clock rate ratio sequencer 62. Divider 60 receives MCLK from the external clock source 56 and outputs two derived signals MCLK1 and MCLK2. These derived signals may be the same rate as MCLK or may be a different (lower) rate based on a comparison that is performed against two internal threshold frequencies. These threshold or trip frequencies are selected according to the particular set of MCLK rates that are to be supported by DAC 30. In the illustrative embodiment, trip frequencies ("$F_1$" and "$F_2$") of 16 MHz ($F_1$) and 24 MHz ($F_2$) are used based on the following set of supported master clock rates (all in MHz):

8.1920
11.2896
12.2880
16.9344
18.4320
22.5792
24.5760
32.7680
33.8680
36.8640
45.1580
49.1520

The selection of particular trip frequencies also reflects potential variations in on-chip signal rates. A trip frequency may fluctuate by as much as ±20% due to process and temperature variations. A sufficient spread therefore exists between the two trip frequencies to ensure that a given MCLK input is properly detected. For example, an MCLK signal of 18 MHz may or may not evaluate to "high" as compared to a nominal trip frequency of 16 MHz since the actual trip frequency might be as high as 20 MHz. However, the 18 MHz signal will always evaluate to "low" as compared to the second trip frequency of 24 MHz. The use of two trip frequencies thus resolves potential ambiguities relating to clocking inaccuracies.

If MCLK is less than $F_1$, then MCLK1 is the same rate as MCLK. Alternatively, if MCLK is greater than $F_1$, then MCLK1 is some fraction of MCLK. In this embodiment, MCLK1 would be one-half the rate of MCLK if MCLK is greater than $F_1$, i.e., the MCLK signal is divided by 2. Similarly, if MCLK is less than $F_2$, then MCLK2 is the same rate as MCLK or, alternatively, if MCLK is greater than $F_2$, then MCLK2 is some fraction of MCLK. Again, in this particular embodiment, MCLK2 would be one-half the rate of MCLK if MCLK is greater than $F_2$. The comparison of MCLK to a trip frequency is done by simply counting the number of MCLK cycles during the trip period.

Figure 5:
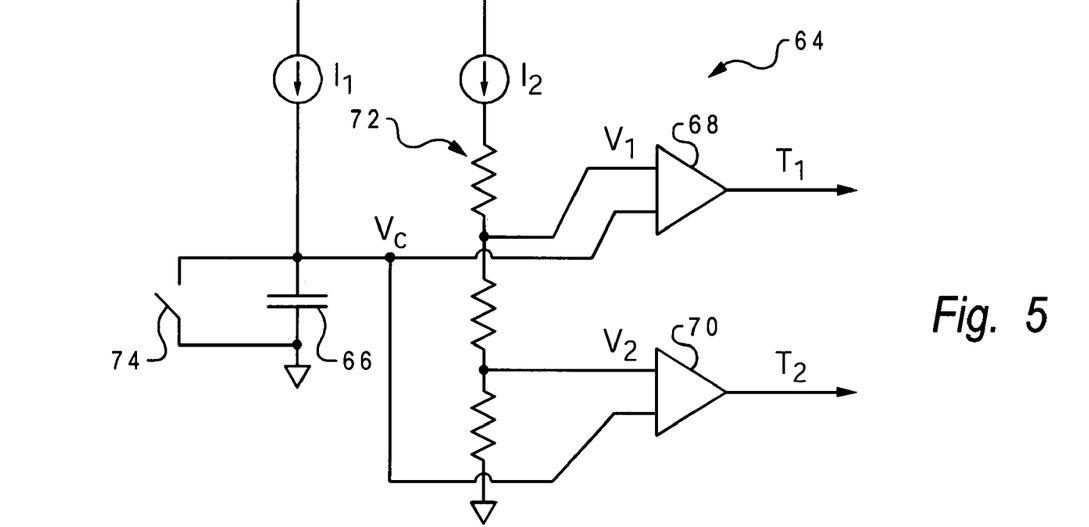
FIG. 5 is a schematic diagram of one embodiment of a timing circuit which is employed to generate two internal trip frequencies that are used by the autodetect unit of FIG. 4 in accordance with the present invention.

The trip frequencies can be provided using internally generated time constants. FIG. 5 depicts one embodiment of a timing circuit 64 that can be used by autodetect unit 36 for this purpose. A first current source $I_1$ is connected to a capacitor 66 and to the inputs of two comparators 68, 70. A second current source $I_2$ is connected to a resistive ladder 72 having nodes that are further connected to the other inputs of comparators 68, 70. In this manner, when a switch 74 at capacitor 66 is opened, the common voltage $V_C$ from the first current source ramps up and, as it eventually reaches the voltages $V_1$ and $V_2$ set by the second current source, triggers comparators 68 and 70 (at different times since $V_1$ is greater than $V_2$). The corresponding output signals $T_1$ and $T_2$ have the prescribed trip frequencies $F_1$ and $F_2$.

Figure 6:
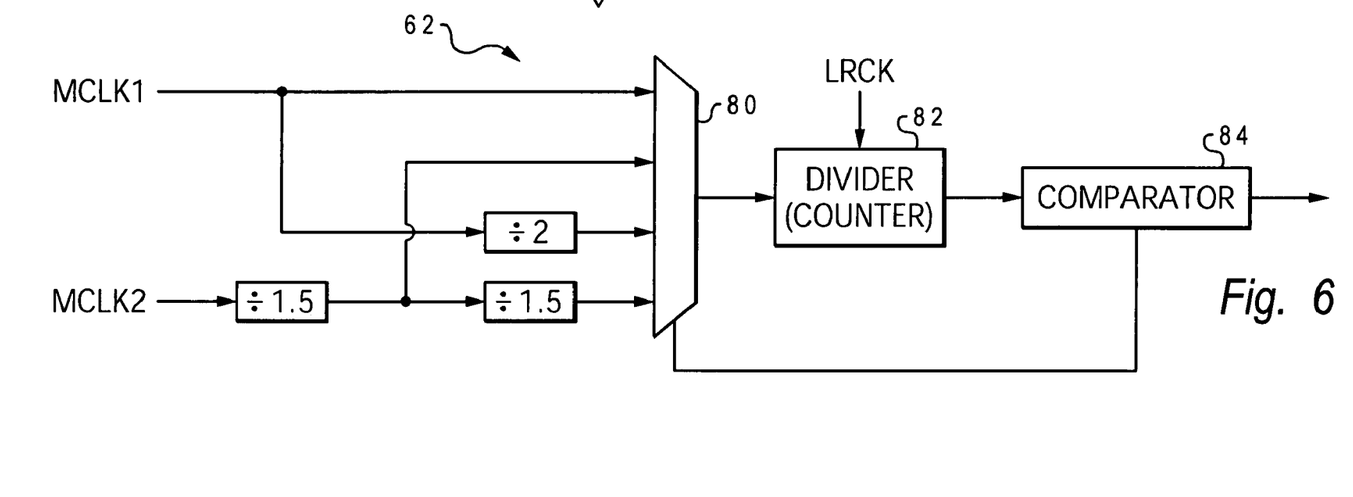
FIG. 6 is a schematic diagram of one embodiment of a clock rate ratio sequencer constructed in accordance with the present invention which is used by the autodetect unit of FIG. 4.

The derived signals MCLK1 and MCLK2 are used by clock rate ratio sequencer 62 to calculate an LRCK ratio which determines the desired operating mode (base, high or quad mode). While only three modes are used in DAC 30, many different frequency combinations of MCLK and LRCK are supported that fall within one of these three modes. FIG. 6 illustrates how clock rate ratio sequencer 62 selects the appropriate MCLK/LCRK ratio. MCLK1 is provided (unchanged) as a first input to a multiplexer 80. MCLK1 is also divided by 2 to provide another input to multiplexer 80. A third input to multiplexer 80 is derived by dividing MCLK2 by 1.5, and a fourth input is derived by dividing MCLK2 by 2.25 (i.e., taking the previously divided MCLK2 signal and dividing again by 1.5). The particular values that are divided into the MCLK1 and MCLK2 rates are not necessarily limited to 1.5 or 2, but these values are exemplary for the previously listed set of supported master clock rates and corresponding LRCK rates. Additionally, while this implementation uses four inputs to multiplexer 80, an alternative embodiment could have more or less inputs depending upon the supported master clock rate and sample clock rate combinations.

The output of multiplexer 80 is passed to a divider/counter 82, which calculates a clock ratio using LRCK. The output of divider/counter 82 is fed to a comparator 84, which examines the ratio to see if it is valid, i.e., if it corresponds to one of a plurality of predetermined clock ratios. In the illustrative embodiment, valid MCLK/LRCK ratios are 256, 128 and 64 (these values are approximate and comparator 84 takes into account a small error tolerance of ±3). These values are selected as valid ratios because they correspond to MCLK/LRCK rates used by various conventional devices, according to this implementation. A ratio of 256 indicates that the base mode of operation is to be used. A ratio of 128 indicates that the high mode of operation is to be used, and a ratio of 64 indicates that the quad mode of operation is to be used. The output of comparator 84 is a 3-bit value having an active bit that indicates the desired mode.

Multiplexer 80 sequences through the inputs in a predetermined manner, starting at the top input as seen in FIG. 6 (MCLK1) and working toward the bottom input (MCLK2/2.25) which ensures that the highest valid ratio will be accepted in case there are multiple valid ratios which might otherwise be calculated. Similarly, comparator 84 first checks for a ratio of 256 from any of the multiplexer inputs. If a ratio of 256 is not found, comparator 84 cycles through the multiplexer inputs a second time searching for a ratio of 128. If a ratio of 128 is not found, then comparator 84 cycles through the multiplexer inputs a third time searching for a ratio of 64. The process stops once any valid ratio is found for the given cycle. If no valid ratio is found (i.e., within the small error range) after sequencing through the multiplexer these three times, then the system resets. The following three examples (which are not to be construed in a limiting sense) illustrate the operation of clock rate ratio sequencer 62.

EXAMPLE 1

MCLK is 18 MHz, LRCK is 48 kHz, and it is assumed that the first trip frequency is close to (or below) its nominal rate of 16 MHz. MCLK will accordingly trip $F_1$ but not trip $F_2$. Therefore:
MCLK1=9 MHz
MCLK2=18 MHz
ratio for first mux input=9 MHz/48 kHz=192
ratio for second mux input=12 MHz/48 kHz=256
ratio for third mux input=4.5 MHz/48 kHz=96
ratio for fourth mux input=8 MHz/48 kHz=167

Result: 256 is identified as a valid ratio during the first check cycle, and the base mode of operation is enabled.

EXAMPLE 2

Similar to Example 1, MCLK is 18 MHz and LRCK is 48 kHz, but it is now assumed that the first trip frequency is greatly above its nominal rate (i.e., it is above 18 MHz). MCLK will accordingly not trip either $F_1$ or $F_2$. Therefore:
MCLK1=18 MHz
MCLK2=18 MHz
ratio for first mux input=18 MHz/48 kHz=384
ratio for second mux input=12 MHz/48 kHz=256
ratio for third mux input=9 MHz/48 kHz=192
ratio for fourth mux input=8 MHz/48 kHz=167

Result: 256 is still identified as a valid ratio during the first check cycle, and the base mode of operation is enabled.

EXAMPLE 3

MCLK is 18 MHz, LRCK is 192 kHz, and it is again assumed that the first trip frequency is close to (or below) its nominal rate of 16 MHz. MCLK will accordingly trip $F_1$ but not trip $F_2$. Therefore:
MCLK1=9 MHz
MCLK2=18 MHz
ratio for first mux input=9 MHz/192 kHz=48
ratio for second mux input=12 MHz/192 kHz=64
ratio for third mux input=4.5 MHz/192 kHz=24
ratio for fourth mux input=8 MHz/192 kHz=43

Result: 64 is identified as a valid ratio during the third check cycle, and the quad mode of operation is enabled.

Figure 7:
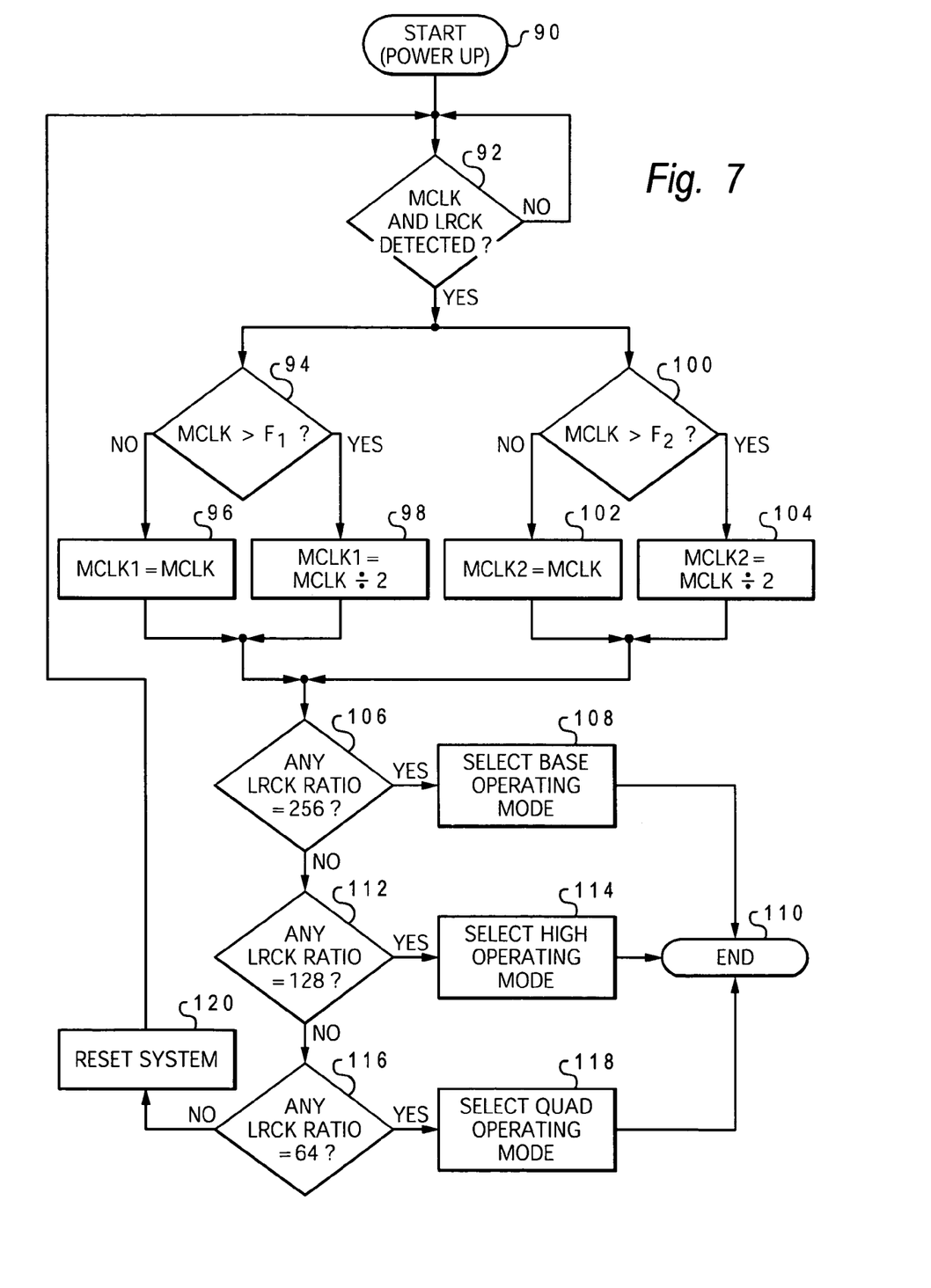
FIG. 7 is a flow chart depicting the logical flow according to an illustrative implementation of the present invention.

The clock autodetect feature of the present invention may be further understood with reference to the flow chart of FIG. 7. The process starts at power up block 90. The autodetect unit waits until both an MCLK and an LRCK are detected at block 92. The MCLK rate is then compared to the first trip frequency at decision block 94. If MCLK is less than or equal to $F_1$, then MCLK1 is set to MCLK at block 96, but if MCLK is greater than $F_1$, then MCLK1 is set to MCLK/2 at block 98. The MCLK rate is also compared to the second trip frequency at decision block 100. If MCLK is less than or equal to $F_2$, then MCLK2 is set to MCLK at block 102, but if MCLK is greater than $F_2$, then MCLK2 is set to MCLK/2 at block 104. These comparison and setting steps at blocks 94–98 and 100–104 are performed in parallel.

The ratios of the derived master clock signals to LRCK are then examined. During the first cycle the sequencer searches for any LRCK ratio equal to 256 at decision block 106. If a ratio of 256 is found, then the base operating mode is selected at block 108, and the autodetect process is complete at end block 110. If no ratio of 256 is found, then the sequencer next searches for any LRCK ratio equal to 128 at decision block 112. If a ratio of 128 is found, then the high operating mode is selected at block 114, and the autodetect process is complete at end block 110. If the sequencer fails to find a ratio of either 256 or 128, then the sequencer searches for any LRCK ratio equal to 64 at decision block 116. If a ratio of 64 is found, then the quad operating mode is selected at block 118, and the autodetect process is complete at end block 110.

If the sequencer never finds a valid ratio after cycling through all the derived MCLK/LRCK ratios, then the system is reset at block 120 and the process begins again at decision block 92. This result might occur due to unusual variations in the clock signal rates, or due to an input clock configuration which is not supported by DAC 30.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of determining a clock configuration for an electronic circuit, comprising:
    deriving first and second comparison rates by comparing a rate of a first clock input of the electronic circuit to first and second trip frequencies;
    calculating a plurality of clock ratios using the first and second comparison rates and a rate of a second clock input of the electronic circuit; and
    determining that at least one of the clock ratios is a valid ratio representing a supported clock configuration.

2. The method of claim 1 wherein:
    the electronic circuit is an audio converter;
    the first clock input is a master clock signal; and
    the second clock input is a sample rate clock signal.

3. The method of claim 1 wherein said deriving includes deriving the first comparison rate by dividing the rate of the first clock input when the rate of the first clock input is greater than the first trip frequency.

4. The method of claim 3 wherein said deriving includes deriving the second clock rate by dividing the rate of the first clock input when the rate of the first clock input is greater than the second trip frequency.

5. The method of claim 1 wherein said calculating includes calculating:
    a first clock ratio of the first comparison rate to the rate of the second clock input;
    a second clock ratio of the second comparison rate to the rate of the second clock input; and
    a third clock ratio of a fraction of the first comparison rate to the rate of the second clock input.

6. The method of claim 5 wherein said determining includes examining the first, second and third clock ratios in a predetermined sequence to select a highest valid ratio among a plurality of valid ratios.

7. A method of determining an internal operating mode for an electronic circuit, comprising:
    deriving at least first and second clock rates from a rate of a first clock input of the electronic circuit;
    dividing at least one of the first and second clock rates to yield a third clock rate;
    computing a ratio of at least one of the first, second and third clock rates to a rate of a second clock input of the electronic circuit;
    determining that the ratio is a valid ratio; and
    selecting an internal operating mode for the electronic circuit based on the valid ratio.

8. The method of claim 7 wherein:
    the electronic circuit is an audio converter;
    the first clock input is a master clock signal; and
    the second clock input is a sample rate clock signal.

9. The method of claim 7 wherein said deriving includes comparing the rate of the first clock input to first and second trip frequencies.

10. The method of claim 9 wherein said deriving includes deriving the first clock rate by dividing the rate of the first clock input when the rate of the first clock input is greater than the first trip frequency.

11. The method of claim 10 wherein said deriving includes deriving the second clock rate by dividing the rate of the first clock input when the rate of the first clock input is greater than the second trip frequency.

12. The method of claim 7 wherein said computing includes sequentially computing:
    a first ratio of the first clock rate to the rate of the second clock input;
    a second ratio of the second clock rate to the rate of the second clock input; and
    a third ratio of the third clock rate to the rate of the second clock input.

13. The method of claim 12 wherein the first, second and third ratios are examined in a predetermined sequence to ensure that said selecting uses a highest valid ratio among a plurality of valid ratios.

14. The method of claim 7 wherein the electronic circuit is adapted to selectively operate in a base clock mode, a high clock mode, and a quad clock mode.

15. The method of claim 14 wherein said selecting includes selecting the base clock mode when the valid ratio is approximately 256, selecting the high clock mode when the valid ratio is approximately 128, and selecting the quad clock mode when the valid ratio is approximately 64.

16. A device for determining a clock configuration for an electronic circuit, comprising:
    a first clock input;
    a second clock input;
    a divider which derives first and second comparison rates from a rate of said first clock input, using first and second trip frequencies;

a sequencer adapted to calculate a plurality of clock ratios using the first and second comparison rates and a rate of said second clock input; and a comparator which determines that at least one clock ratio from said sequencer is a valid ratio representing a supported clock configuration, said comparator providing an output which indicates the supported clock configuration.

17. The device of claim 16 wherein the first comparison rate is the same as the rate of said first clock input when the rate of said first clock input is less than or equal to the first trip frequency and is a fraction of the rate of said first clock input when the rate of said first clock input is greater than the first trip frequency, and the second comparison rate is the same as the rate of said first clock input when the rate of said first clock input is less than or equal to the second trip frequency and is a fraction of the rate of said first clock input when the rate of said first clock input is greater than the second trip frequency.

18. The device of claim 16 wherein:
the electronic circuit is an audio converter;
said first clock input is a master clock signal; and
said second clock input is a sample rate clock signal.

19. The device of claim 16 wherein said sequencer computes:
a first ratio of the first comparison rate to the rate of said second clock input;
a second ratio of a fraction of the second comparison rate to the rate of said second clock input; and
a third ratio of a fraction of the first comparison rate to the rate of said second clock input.

20. The device of claim 19 wherein said comparator examines the first, second and third ratios in a predetermined sequence to ensure that a highest valid ratio is used among a plurality of valid ratios.

21. The device of claim 16 wherein:
the electronic circuit is adapted to selectively operate in a base clock mode, a high clock mode, and a quad clock mode; and
said comparator outputs a 3-bit value to indicate the supported clock configuration.

22. The device of claim 21 wherein said comparator selects the base clock mode when the valid ratio is approximately 256, selects the high clock mode when the valid ratio is approximately 128, and selects the quad clock mode when the valid ratio is approximately 64.

23. A clock autodetect unit for an audio converter comprising:
a master clock input;
a sample rate clock input;
a divider which derives at least first and second clock comparison rates from a rate of said master clock input, wherein the first clock comparison rate is the same as the rate of said master clock input when the rate of said master clock input is less than or equal to a first trip frequency and is a fraction of the rate of said master clock input when the rate of said master clock input is greater than the first trip frequency, the second clock comparison rate is the same as the rate of said master clock input when the rate of said master clock input is less than or equal to a second trip frequency and is a fraction of the rate of said master clock input when the rate of said master clock input is greater than the second trip frequency, and the second trip frequency is greater than the first trip frequency;
a multiplexer having at least four inputs, a first of said multiplexer inputs receiving the first clock comparison rate, a second of said multiplexer inputs receiving a first fraction of the second clock comparison rate, a third of said multiplexer inputs receiving a fraction of the first clock comparison rate, and a fourth of said multiplexer inputs receiving a second fraction of the second clock comparison rate;
a counter which receives an output rate from said multiplexer and computes a ratio of the output rate to a rate of said sample rate clock input; and
a comparator controlling said multiplexer which sequentially compares ratios from the counter to a plurality of valid ratios representing supported clock configurations and determines that a computed ratio is valid, said comparator providing an output indicative of the computed ratio.

24. The clock autodetect unit of claim 23 wherein the valid ratios represent supported clock configurations for the rate of said master clock input varying between 8.1920 MHz and 49.1520, and the rate of said sample rate clock input varying between 32 kHz and 192 kHz.

25. The clock autodetect unit of claim 24 wherein:
the first trip frequency is about 16 MHz; and
the second trip frequency is about 24 MHz.

26. The clock autodetect unit of claim 24 wherein:
the audio converter is adapted to selectively operate in at least a base clock mode, a high clock mode, and a quad clock mode; and
said comparator selects the base clock mode when the computed ratio is approximately 256, selects the high clock mode when the computed ratio is approximately 128, and selects the quad clock mode when the computed ratio is approximately 64.

27. The clock autodetect unit of claim 23 wherein:
the first clock comparison rate is equal to the rate of said master clock input divided by 2 when the rate of said master clock input is greater than the first trip frequency, and the second clock comparison rate is equal to the rate of said master clock input divided by 2 when the rate of said master clock input is greater than the second trip frequency.

28. The clock autodetect unit of claim 27 wherein:
said second multiplexer input receives the second clock comparison rate divided by 1.5;
said third multiplexer input receives the first clock comparison rate divided by 2; and
said fourth multiplexer input receives the second clock comparison rate divided by 2.25.

29. A digital-to-analog converter comprising:
a data input;
at least one delta-sigma modulator which receives a digital data stream from said data input and generates quantized values;
an analog filter which outputs an analog signal based on the quantized values;
a master clock input;
a sample rate clock input; and
a clock autodetect unit which derives multiple comparison rates from a rate of said master clock input, computes one or more clock ratios of the comparison rates to a rate of said sample rate clock input, and determines whether any of the clock ratios is a valid ratio representing a supported clock configuration.

30. The digital-to-analog converter of claim 29 wherein said clock autodetect unit at least derives:
a first clock comparison rate which is the same as the rate of said master clock input when the rate of said master clock input is less than or equal to a first trip frequency and is a fraction of the rate of said master clock input when the rate of said master clock input is greater than the first trip frequency; and a second clock comparison rate which is the same as the rate of said master clock input when the rate of said master clock input is less than or equal to a second trip frequency and is a fraction of the rate of said master clock input when the rate of said master clock input is greater than the second trip frequency.

31. The digital-to-analog converter of claim 29 wherein said clock autodetect unit further provides an output indicative of the valid ratio.

32. The digital-to-analog converter of claim 31 wherein said analog filter operates in different modes based on the output of the clock autodetect unit.

\* \* \* \* \*